(12) United States Patent
Nguyen et al.

(10) Patent No.: US 7,713,592 B2
(45) Date of Patent: *May 11, 2010

(54) NANOLAYER DEPOSITION PROCESS

(75) Inventors: Tue Nguyen, Fremont, CA (US); Tai Dung Nguyen, Fremont, CA (US)

(73) Assignee: Tegal Corporation

( * ) Notice: Subject to any disclaimer, the term of this patent is extended or adjusted under 35 U.S.C. 154(b) by 505 days.

This patent is subject to a terminal disclaimer.

(21) Appl. No.: 10/360,135

(22) Filed: Feb. 4, 2003

(65) Prior Publication Data

US 2004/0151845 A1    Aug. 5, 2004

(51) Int. Cl.
    *H05H 1/24* (2006.01)
(52) U.S. Cl. .............. 427/535; 427/97.1; 427/97.4; 427/255.7
(58) Field of Classification Search .......... 427/248.1, 427/255.391, 255.7, 569, 576, 535, 97.1, 427/97.4, 98.2, 99.2
    See application file for complete search history.

(56) References Cited

U.S. PATENT DOCUMENTS

| | | | |
|---|---|---|---|
| 3,632,406 A * | 1/1972 | Clough et al. ............ 427/255.5 |
| 4,439,463 A * | 3/1984 | Miller ...................... 427/563 |
| 4,783,248 A * | 11/1988 | Kohlhase et al. ....... 204/192.17 |
| 5,102,694 A | 4/1992 | Taylor et al. |
| 5,242,530 A | 9/1993 | Batey et al. |
| 5,344,792 A | 9/1994 | Sandhu et al. |
| 5,460,689 A * | 10/1995 | Raaijmakers et al. ....... 438/713 |
| 5,773,363 A * | 6/1998 | Derderian et al. .......... 438/672 |
| 5,792,522 A * | 8/1998 | Jin et al. ..................... 427/575 |
| 5,916,365 A | 6/1999 | Sherman |
| 5,968,610 A * | 10/1999 | Liu et al. .................... 438/435 |
| 5,981,373 A * | 11/1999 | Sunada ....................... 438/624 |
| 5,985,375 A | 11/1999 | Donohoe et al. |
| 6,015,590 A | 1/2000 | Suntola et al. |

(Continued)

FOREIGN PATENT DOCUMENTS

JP    10064849 A  *  3/1998

(Continued)

OTHER PUBLICATIONS

International Search Report dated Sep. 2, 2004.

*Primary Examiner*—Bret Chen
(74) *Attorney, Agent, or Firm*—Fliesler Meyer LLP

(57) ABSTRACT

A hybrid deposition process of CVD and ALD, called Nano-Layer Deposition (NLD) is provided. The nanolayer deposition process is a cyclic sequential deposition process, comprising the first step of introducing a first plurality of precursors to deposit a thin film with the deposition process not self limiting, then a second step of purging the first set of precursors and a third step of introducing a second plurality of precursors to modify the deposited thin film. The deposition step in the NLD process using the first set of precursors is not self limiting and is a function of substrate temperature and process time. The second set of precursors modifies the already deposited film characteristics. The second set of precursors can treat the deposited film such as a modification of film composition, a doping or a removal of impurities from the deposited film. The second set of precursors can also deposit another layer on the deposited film. The additional layer can react with the existing layer to form a compound layer, or can have minimum reaction to form a nanolaminate film.

13 Claims, 3 Drawing Sheets

U.S. PATENT DOCUMENTS

| | | | |
|---|---|---|---|
| 6,040,021 A * | 3/2000 | Miyamoto | 427/576 |
| 6,089,184 A * | 7/2000 | Kaizuka et al. | 118/723 VE |
| 6,159,842 A * | 12/2000 | Chang et al. | 438/622 |
| 6,200,651 B1 | 3/2001 | Roche et al. | |
| 6,200,893 B1 | 3/2001 | Sneh | 438/685 |
| 6,268,288 B1 * | 7/2001 | Hautala et al. | 438/680 |
| 6,306,211 B1 | 10/2001 | Takahashi et al. | |
| 6,331,493 B1 * | 12/2001 | Sharan | 438/765 |
| 6,333,202 B1 * | 12/2001 | Adkisson et al. | 438/3 |
| 6,406,991 B2 * | 6/2002 | Sugihara | 438/613 |
| 6,436,819 B1 * | 8/2002 | Zhang et al. | 438/656 |
| 6,451,390 B1 | 9/2002 | Goto et al. | |
| 6,451,695 B2 | 9/2002 | Sneh | |
| 6,475,910 B1 | 11/2002 | Sneh | |
| 6,521,529 B1 * | 2/2003 | Ngo et al. | 438/664 |
| 6,560,991 B1 * | 5/2003 | Kotliar | 62/640 |
| 6,756,318 B2 * | 6/2004 | Nguyen et al. | 438/758 |
| 6,987,059 B1 * | 1/2006 | Burke et al. | 438/627 |
| 7,148,155 B1 * | 12/2006 | Tarafdar et al. | 438/778 |
| 7,235,484 B2 * | 6/2007 | Nguyen et al. | 438/680 |
| 2002/0192954 A1 | 12/2002 | Sneh | |
| 2002/0197403 A1 * | 12/2002 | Arkles et al. | 427/255.392 |
| 2002/0197864 A1 | 12/2002 | Sneh | |
| 2003/0082296 A1 * | 5/2003 | Elers et al. | 427/96 |

FOREIGN PATENT DOCUMENTS

JP    10-064849 A    3/2001

* cited by examiner

NANOLAYER DEPOSITION PROCESS

BACKGROUND OF THE INVENTION

The present invention relates to the deposition of a thin film and specifically to semiconductor thin film processing.

Deposition is one of the basic fabrication processes of modern semiconductor device structures. Deposition techniques includes Physical Vapor Deposition (PVD, or sputtering), and Chemical Vapor Deposition (CVD) and numerous variations of CVD such as pulsed CVD, sequential CVD or Atomic Layer Deposition (ALD).

PVD process uses a high vacuum apparatus and generated plasma that sputters atoms or clusters of atoms toward the surface of the wafer substrates. PVD is a line of sight deposition process that is more difficult to achieve conform film deposition over complex topography such as deposition of a thin and uniform liner or barrier layer over the small trench or via of 0.13 µm or less, especially with high aspect ratio greater than 4:1.

CVD method is different from PVD method. In CVD, a gas or vapor mixture is flowed over the wafer surface at an elevated temperature. Reactions then take place at the hot surface where deposition takes place. The basic characteristic of CVD process is the reaction at the substrate of all the precursors vapors together. The reaction often requires the presence of an energy source such as thermal energy (in the form of resistive heated substrate, or radiative heating), or plasma energy (in the form of plasma excitation). Temperature of the wafer surface is an important factor in CVD deposition, because the deposition depends on the reaction of the precursors and affects the uniformity of deposition over the large wafer surface. CVD typically requires high temperature for deposition which may not be compatible with other processes in the semiconductor process. CVD at lower temperature tends to produce low quality films in term of uniformity and impurities. The reactions can be further promoted by plasma energy in plasma enhanced CVD process, or by photon energy in rapid thermal CVD process. CVD technology has been used in semiconductor processing for a long time, and its characteristics are well known with a variety of precursors available. However, CVD process needs major improvements to meet modern technology requirements of new materials and more stringent film qualities and properties.

Variations of CVD include pulse CVD or sequential CVD. In pulse or sequential CVD, the chemical vapors or the supplied energies such as plasma energy, thermal energy, laser energy are pulsed instead of continuous as in CVD process. The major advantages of pulse CVD is the high effects of the transient state resulted from the on-off status of the precursors or the energies, and the reduced amount of precursors or energies due to the pulsed mode. Reduced energy is desirable which can be accomplished in pulsed mode since it leads to less substrate damage such as the case of plasma processing for thin gate oxide. Reduced precursor is desirable which can be accomplished in pulsed mode for specific applications such as epitaxial deposition where the precursors need to react with the substrate in an arrangement to extend the single crystal nature of the substrate. There are no purging steps in pulsed CVD since cross contaminations or gas phase reactions are not a concern, and the purpose of the pulsing of the precursors or energies is to obtain the desired film characteristics.

Pulsed CVD can be used for create gradient deposition such as U.S. Pat. No. 5,102,694 of Taylor et al. Taylor discloses a pulsed deposition process in which the precursors are periodically reduced to create a gradient of composition in the deposited films. Taylor's pulsed CVD relies only on the changing of the first set of precursors to vary the film compositions.

Pulsed CVD can be used to modulate the precursors flow such as U.S. Pat. No. 5,242,530, titled "Pulsed gas plasma-enhanced chemical vapor deposition of silicon", of Batey et al. Batey discloses a pulsed deposition process in which the precursor silane is modulated during a steady flow of plasma hydrogen. The pulsing of silane creates a sequence of deposition and without the silane pulses, the steady plasma hydrogen cleans and prepare the deposited surface.

Pulsed CVD can be used to pulse the plasma energy needed for the deposition process such as U.S. Pat. No. 5,344,792, titled "Pulsed plasma enhanced CVD of metal silicide conductive films such as $TiSi_2$", of Sandhu et al. Sandhu discloses a pulsed deposition process in which the precursors are introduced into a process chamber, then the plasma energy is introduced in pulsed mode to optimize the deposition conditions. U.S. Pat. No. 5,985,375, titled "Method for pulsed plasma enhanced vapor deposition", of Donohoe et al. discloses a similar pulsed CVD process with the plasma energy in pulsed mode but with a power-modulated energy waveform. The pulsing of the plasma energy allows the deposition of a metal film with desired characteristics. U.S. Pat. No. 6,200,651, titled "Method of chemical vapor deposition in a vacuum plasma processor responsive to a pulsed microwave source", of Roche et al. discloses a pulsed CVD process with an electron cyclotron resonance plasma having repetitive pulsed microwave field to optimize the deposited films. U.S. Pat. No. 6,451,390, titled "Deposition of TEOS oxide using pulsed RF plasma", of Goto et al. discloses a TEOS oxide deposition process using a pulsed RF plasma to control the deposition rate of silicon dioxide. The pulsing feature offers the optimization of the deposit films through the transient state instead of the steady state. Pulsing of plasma during nitridation process of gate oxide shows less damage than continuous plasma nitridation process because of higher interaction due to plasma transient state and less damage due to shorter plasma time.

Pulsed CVD can be used to pulse the precursors needed for the deposition process such as U.S. Pat. No. 6,306,211, titled "Method for growing semiconductor film and method for fabricating semiconductor devices", of Takahashi et al. Takahashi discloses a pulsed CVD process to deposit epitaxial film of $Si_xGe_yC_z$. Epitaxial deposition requires a single crystal substrate, and the deposited film extends the single crystal nature of the substrate, different from CVD poly crystal or amorphous film deposition. To extend the single crystal nature of the substrate, the deposited precursors need to bond with the substrate at specific lattice sites, therefore a reduced precursor flow is highly desirable in epitaxial deposition to allow the precursors enough time to rearrange into the correct lattice sites. The process includes a continuous flow of hydrogen to dilute the precursors to be introduced. Then sequential pulses of silicon-based precursor, germanium-based precursor and carbon-based precursor are introduced to deposit an epitaxial film of $Si_xGe_yC_z$. To deposit epitaxial film, little amounts of precursors are needed, and this can be accomplished by short pulses (order of micro seconds) and further diluted in high flow of hydrogen. Takahashi discloses that the pulses of the precursors are not overlapped, but is silent on the separation of these pulses. The objective of Takahashi pulsed CVD is to deposit compound films, therefore the separation of these precursors is not relevant.

Pulsed CVD as described by Takahashi et al. to deposit epitaxial film of $Si_xGe_yC_z$, does not allow deposition of high coverage or conformal film on a non-flat substrate, such as in a via or trench for interconnects in semiconductor devices. The objective of Takahashi pulsed CVD is to deposit epitaxial films with sufficiently planar surface as observed by Takahashi et al., without mentioning of possible deposition on trenches or vias.

ALD is another variation of CVD using chemical vapor for deposition. In ALD, various vapors are injected into the chamber in alternating and separated sequences. For example, a first precursor vapor is delivered into the chamber to be adsorbed on the substrate, then the first vapor is turned off and evacuated from the chamber. Another precursor vapor is then delivered into the chamber to react with the adsorbed molecules on the substrate to form a desired film. Then this vapor is turned off and evacuated from the chamber. This sequence is repeated for many cycles until the deposited film reaches the desired thickness. There are numerous variations of ALD processes, but the ALD processes all share two common characteristics: sequentially precursor vapors flow and self-limiting thickness per cycle. The sequential precursor flow and evacuation characteristic offers the elimination of gas phase reaction commonly associated with CVD process. The self-limiting thickness per cycle characteristic offers the excellent surface coverage, because the total film thickness does not depend on precursor flow, nor on process time. The total film thickness depends only on the number of cycles. The ALD process then is not sensitive to the substrate temperature.

The maximum thickness per cycle of ALD process is one monolayer because of the self limiting feature that the substrate surface is saturated with the first precursor. The first precursor can adsorb on the substrate, or the first precursor can have some reaction at the substrate, but the first precursor also saturate the substrate surface and the surface is terminated with a first precursor ligand.

The throughput of ALD process depends on how fast a cycle is, and therefore a small chamber volume is critical. Furthermore, the fast switching of the precursor valves is desirable to allow a high throughput. A typical ALD cycle is a few seconds long, therefore the precursor pulses are in order of second. Precursor depletion effect can be severe for this short process time.

U.S. Pat. No. 5,916,365 to Sherman entitled "Sequential chemical vapor deposition" provides for sequential chemical vapor deposition (ALD) by a sequence of chamber evacuating, adsorption of the first precursor onto the substrate, then another chamber evacuation, then a second radical precursor to react with the adsorbed precursor on the substrate surface, and a third chamber evacuation. The Sherman process produces sub-monolayers per cycle due to adsorption. The process cycle can be repeated to grow the desired thickness of film. Sherman discloses an ALD process in which the first precursor process flow is self-limiting, meaning no matter how long the process is, the adsorption thickness cannot changed. U.S. Pat. No. 6,015,590 to Suntola et al., entitled "Method for growing thin films" discloses an ALD process which completely separates the precursors. Suntola process is an improved ALD process (called ALE by Suntola) meaning the deposition is achieved through the saturation of precursors on the substrate surface and the subsequent reaction with the reactants. The advantage of Suntola process is the complete separation of precursors, with a better than 99% purging between pulses of precursors to prevent cross reactions.

U.S. Pat. No. 6,200,893, and its divisions (U.S. Pat. No. 6,451,695, U.S. Pat. No. 6,475,910, U.S. patent publication 2001/0002280, U.S. patent publication 2002/0192954, U.S. patent publication 2002/0197864) to Sneh entitled "Radical-assisted sequential CVD" discusses a method for ALD deposition. Sneh sequence process is a variation of ALD process. Sneh discloses a deposition step for the first precursor introduction, but the deposition of Sneh is self limiting because of the surface saturation with ligands. In fact, in U.S. Pat. No. 6,475,910, Sneh discloses a method to extend the thickness of the first precursor introduction step. The disclosure discloses another ALD process to sequential precursor flows to increase the thickness of the first precursor introduction step. In a way, this is similar to a nested loop, where the thickness of the first precursor flow step of an ALD process can be increased by another ALD process.

SUMMARY OF THE INVENTION

The present invention provides a hybrid deposition process of CVD and ALD, called NanoLayer Deposition (NLD). A co-pending application "Nanolayer thick film processing system and method" of the same authors, Ser. No. 09/954,244, filed Sep. 10, 2001 and published Mar. 13, 2003, Pub. No. 20030049375 A1, has been disclosed and is hereby incorporated by reference.

In one aspect of the invention, the present invention method to deposit a thin film on a substrate comprises the steps of:

a. introducing a first plurality of precursors to deposit a thin film on a substrate, the deposition process being not self limiting;

b. purging the first precursors; and c. introducing a second plurality of precursors to modify the deposited thin film, the second plurality of precursors having at least one precursor different from the first plurality of precursors.

The deposition step in the present invention is not self limiting and is a function of substrate temperature and process time. This first step is similar to a CVD process using a first set of precursors. Then the first set of precursors is turned off and purged and a second set of precursors is introduced. The purpose of the purging step is to avoid the possible interaction between the two sets of precursors. Therefore the purging can be accomplished by a pumping step to evacuate the existing precursors in the process chamber. The characteristic of the pumping step is the reduction in chamber pressure to evacuate all gases and vapors. The purging can also be accomplished by a replacement step by using a non reacting gas such as nitrogen or inert gas to push all the precursors out of the process chamber. The characteristic of the replacement step is the maintaining of chamber pressure, with the precursor turned off and the purge gas turned on. A combination of these two steps can be use in the purging step, such as a pumping step followed by a nitrogen or argon replacement step. The second set of precursors modifies the already deposited film characteristics. The second set of precursors can treat the deposited film such as a modification of film composition, a doping or a removal of impurities from the deposited film. The second set of precursors can also deposit another layer on the deposited film. The additional layer can react with the existing layer to form a compound layer, or can have minimum reaction to form a nanolaminate film. The deposition step is preferably a disordered film deposition, in contrast to an ordered film deposition as in an epitaxial film. Deposition conditions for disordered film deposition are much simpler to achieve with less initial surface preparation and less special considerations relating to the order of the deposited films. In ordered film deposition like epitaxial film deposition, small amount of precursors is typically used to allow the precursors the needed time to arrange themselves on the surface to form crystalline film. For that purpose, pulsed CVD is highly suited for epitaxial film deposition. The epitaxial deposition also requires a buffer layer to ensure a continuous lattice growth, especially with a dis-similar lattice structure of the substrate and the deposited film.

The present NLD method to deposit a film differs markedly from CVD method with a sequential process and with the introduction of the second set of precursors. The present NLD method differs from pulse or sequential CVD with a purging step and with the introduction of the second set of precursors. The introduction of the second set of precursors after purging the first precursors in a cyclic sequential process allows the modification of the deposited film in a manner not possible in CVD and pulse and sequential CVD methods.

The pulsed CVD processes employing the pulsing of precursors to modify the composition such as gradient of the deposited films differ from the present invention NLD process because of the lacking of the second set of precursors to modify the properties of the deposited films.

The pulsed CVD processes employing the pulsing of deposition precursors in the presence of plasma precursors to modify the deposited film characteristics such as a smoother surface differ from the present invention differs from the present invention NLD process because of the lack of the purging step between the pulses, and because the plasma precursors are present throughout the deposition time. This pulsed CVD process allows the mixture of the continuous plasma precursors and the deposition precursors. Instead, the NLD process offers a purging step between the two sets of precursors to avoid cross contamination, to avoid possible gas phase reaction and to prepare the process chamber for different processes. For example, the purging step clear out the precursor such as an MOCVD precursor before turning on the plasma because the plasma is difficult to strike with the presence of a vapor.

The pulsed CVD processes employing the pulsing of plasma energy to modify the deposited film characteristics such as smoother film, different deposition rate, less damage to the deposited films differ from the present invention NLD process because of the lacking of the second set of precursors to modify the properties of the deposited films and the lacking of the purging step between the pulses. The pulsing feature offers the optimization of the deposit films through the transient state instead of the steady state, and therefore differ significantly with the present invention NLD method of using the second set of precursors to modify the deposited film characteristics.

The pulsed CVD processes employing the pulsing of deposition precursors to form epitaxial film differ from the present invention NLD process because of the lacking of the purging step between the precursors pulses. The purging step allows the use of incompatible precursors due to the separation effect of the purging step. The difference between pulsed CVD and NLD also includes the conceptual purpose of the two methods. The objective of pulsed CVD is to employ a suitable set of precursors and conditions to deposit the desired films, while the objective of NLD is to deposit a film, even an undesired film, and to provide a modification and treatment step to convert the undesired film into a desired film. Instead of finding a way to deposit a film with all the desired characteristics as in CVD or pulsed CVD, NLD finds a way to treat or modify an existing film to achieve a film with the desired characteristics. Further, recognizing that treating and modifying an existing is difficult when the thickness is large, NLD offers a cyclic process of depositing and treating or modifying, so that the treatment process is performed on very thin film and to achieve a thicker film.

The present NLD method to deposit a film also differs markedly from ALD method with a non self-limiting deposition step. The deposition step in the present invention NLD method is a function of substrate temperature and process time. The deposition/adsorption step in ALD method is a self-limiting step based on the saturation of precursor ligands on the substrate surface. Once the surface is saturated, the deposition/adsorption in ALD method stops and any excess precursor vapors have no further effect on the saturated surface. In other words, the deposition/adsorption step of ALD method is independent of time after reaching saturation. The ALD method also has less dependent on substrate temperature than CVD or NLD methods. Therefore the present invention NLD method has many distinct differences from ALD method.

In other aspect of the invention, the method of deposition further comprises a last purging step after step c. Similar the previous purging step, the last purging step is to remove the second set of precursors from the process chamber, either by evacuation, by replacement, or any combinations. In many applications, the treatment step can only treat a thin film, or the treatment step is much more effective if treating only a thin film, therefore the present invention further comprises a further step of repeating the previous steps until a desired thickness is reached. The last purging step can be optional because its purpose is to prevent possible reaction between the two sets of precursors. In cases that there are minimal reactions between these two sets of precursors, the last purging step can be eliminated to have a shorter process time and higher throughput.

The present invention also provides for the extension to a plurality of other sets of precursors. Another third set of precursors would enhanced the modification of the deposited film at the expense of process complexity and lower throughput. Another two sets of precursors would create a multilayer thin film or a nanolaminate film.

The present invention NLD process can be performed in any process chamber such as a standard CVD process chamber or an ALD small volume, fast switching valve process chamber. The chamber wall can be cold wall, or warm wall, or hot wall depending on the desired outputs. The delivery system can be showerhead delivery to provide uniform flow, or a sidewall inlet to provide laminar flow, or a shower ring to offer circular delivery. The precursor delivery can be liquid injection where the liquid precursors are delivered to a heated vaporizer to convert the precursors into vapor form before delivering into the process chamber. The precursor delivery can be vapor draw where the vapor of a liquid precursor is drawn from the liquid precursor container. The precursor delivery can be bubbler where the vapor of the liquid precursor is enhanced with the bubbling feature of a non reactive carrier gas.

The steps in the present invention can be any CVD deposition step such as thermal activated CVD, plasma enhanced CVD using parallel plate plasma, or inductive coupled plasma (ICP), or microwave plasma, or remote plasma, or rapid thermal processing using lamp heating. Not only the deposition step can be a deposition step, the treatment step can also be a CVD deposition step to modify the deposited film properties.

The treatment step can be a plasma treatment, or a temperature treatment. The plasma treatment can be an energetic species, and can be further enhanced with a bias to give kinetic energy to the energetic species. A strong bias can create reaction such as an ion implantation as in immersion ion implantation technology. In general, a highly energetic species in the treatment step can help in modification the deposited film properties. A bombardment of species can be employed to improve the roughness of the deposited film. A chemical reaction can be employed to remove impurities or to change film compositions and to modify the physical properties such as film density.

The present invention method can use any CVD precursors or MOCVD precursors. The deposition step is further enhanced with the second set of precursors to allow film properties that are difficult or impossible with CVD method. The precursors can be thermal activated, plasma activated or RTP activated. The precursors can be hydrogen, nitrogen, oxygen, ozone, inert gas, water, or inorganic precursors such as $NH_3$, $SiH_4$, $NF_3$, or metal precursors such as $TiCl_4$, or organic precursors, or metal organic precursors such as TDMAT, TDEAT, TMEAT, PDMAT, PDEAT.

In general, the process temperature of the present invention is lower than the temperature of similar CVD process to obtain the lower deposition rate and better uniformity. A typical process temperature is between 100° C. to 1000° C., depending on the thermal budget of the overall process. Metal interconnect of a semiconductor process requires the process temperature to be less than 500° C., and the new low dielectric constant (low k) interlevel dielectric process requires the process temperature to be less than 400° C., or even 350° C. For device fabrication, the temperature can be higher, up to 600° C. or even 800° C.

The process time of the present invention of each step is between the range of msec to many minutes. Shorter process time is desirable, but too short a process time can create many reliability issues such as timing requirements, component requirements. A typical throughput of 10 to 60 wafers per hour is acceptable for semiconductor fabrication. Using about 4 to 20 cycles per film thickness, that translates to about 3 to 90 seconds per step.

One aspect of the present invention is the plasma energy. To treat the sidewall surface of a high aspect ratio trench, the plasma is a high density and high pressure plasma. High density plasma can be accomplished with ICP or microwave. High density plasma can also be accomplished with remote plasma.

High pressure plasma can be a little harder. High density and high pressure plasma require a high energy in the chamber volume to compensate for the high collision loss due to the presence of many charged and neutral particles. To increase the power delivered to the chamber volume, an ICP power source needs to be close to the chamber volume and contains many inductive segments. These two requirements are difficult to fulfill because as the number of inductive segments increase, they are farther away from the chamber volume due to the size of the inductive segments. The inductive segments are typically a coil for the plasma source and carry a large current, therefore need to be water cooled. Conventional inductive coil has cross section of a square or a circle with a hollow center for water cool flow. The increase of number of inductive coil turns will increase the power, but since the successive turns are farther away from the chamber, the power increase is somewhat reduced, and at a certain distance, the power increase is no longer significant. Our plasma inductive coils is an innovation design and has a ribbon-like cross section with the width is many times larger than the thickness. A co-pending application "Plasma semiconductor processing system and method" of the same authors, Ser. No. 09/898,439, filing date Jul. 5, 2001 has been disclosed. With the thickness of the helical ribbon inductive coil is much less, order of mm as compared to 5 or 10 mm as conventional inductive coil, the inductive coils are much closer to the chamber volume and therefore can deliver a high power to the process chamber, resulting in a high density, high pressure plasma for sidewall structure treatments. The heat removal issue of the helical ribbon is much more significant than the conventional inductive coils, but it is an engineering issue and can be solved. With this new source of plasma, our process chamber pressure can be as high as 1000 milliTorr, and with further improvement, can reach 5 Torr, as compared to the typical process pressure of 10 to 100 milliTorr. As a result, the sidewall treatment of our process can be very good and the result is close to 100% conformality at the sidewall and the top and bottom surface.

DETAILED DESCRIPTION OF THE INVENTION

Figure 1:
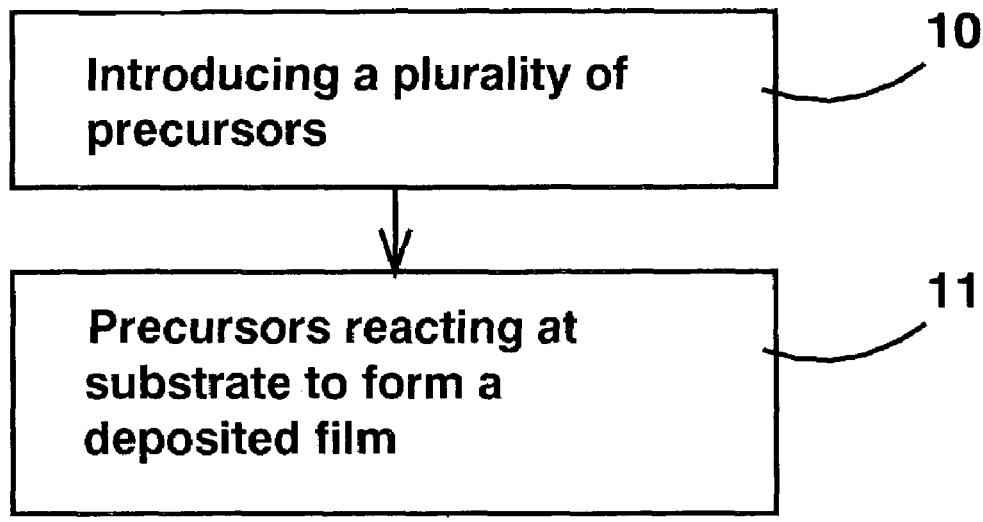
FIG. 1 is a flowchart of a prior art CVD process.

FIG. 1 shows a flowchart of a prior art CVD process. In step 10, the precursors are introduced into the process chamber. The precursors are then react at the substrate surface to form a deposited film in step 11. The conditions for the precursors reaction can include plasma energy, thermal energy, photon energy, laser energy. The deposition characteristics of CVD process is the non self-limiting nature, meaning increase with process time and substrate temperature.

Figure 2:
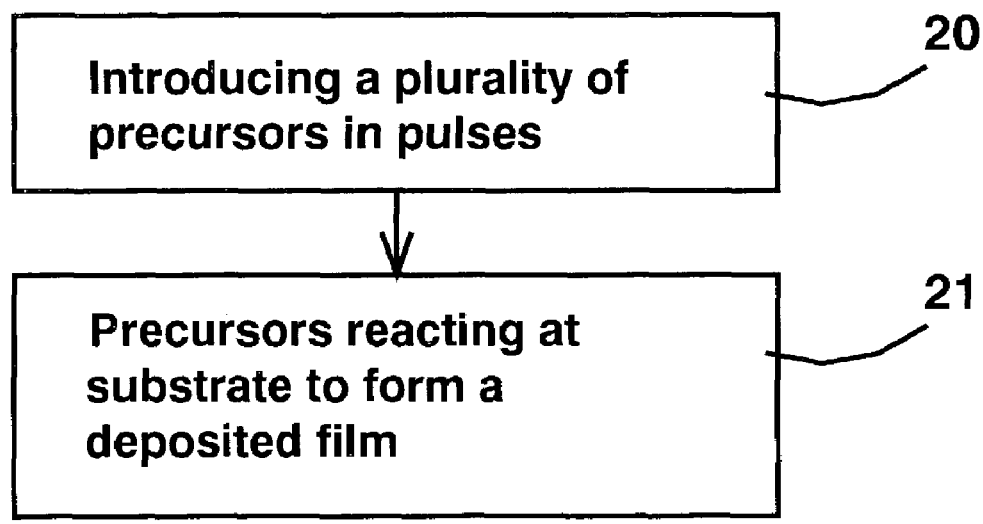
FIG. 2 is a flowchart of a prior art pulse CVD process.

FIG. 2 shows a flowchart of a prior art pulse CVD process. In step 20, the precursors are introduced into the process chamber in pulses. The precursors are then react at the substrate surface to form a deposited film in step 21. Similar to CVD process, pulse CVD process can incorporate plasma energy, thermal energy, photon energy, laser energy. The pulse CVD process conditions can include precursor pulsing, plasma pulsing, thermal energy pulsing, photon energy pulsing, and laser energy pulsing. The deposition characteristics of pulse CVD process is the repeated CVD deposition process.

Figure 3:
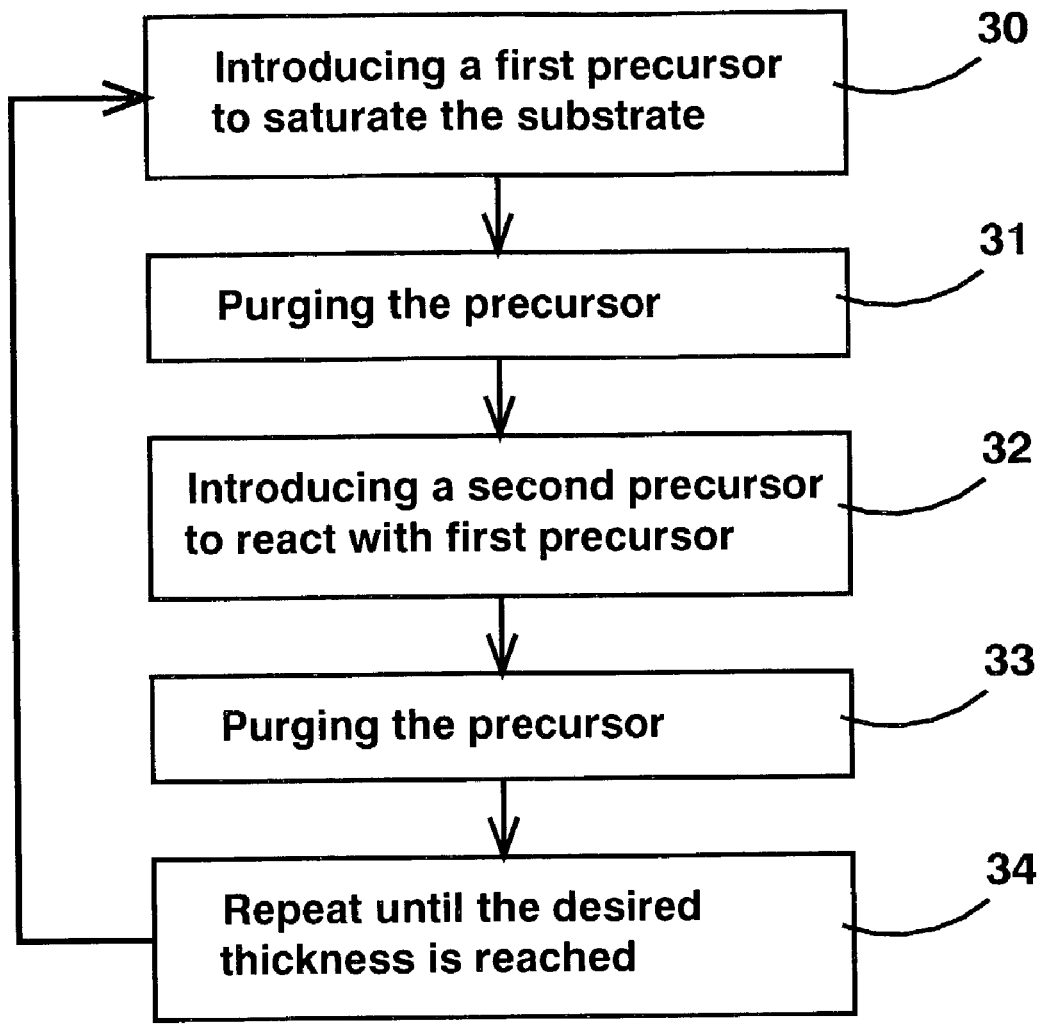
FIG. 3 is a flowchart of a prior art ALD process.

FIG. 3 shows a flowchart of a prior art ALD process. In step 30, the precursors are introduced into the process chamber. Then the precursors are purged from the process chamber in step 31. Another set of precursors is introduced into the process chamber in step 32. Then this set of precursors is purged from the process chamber in step 33. This purging step 33 is optional. The sequence can be repeated in step 34 until a desired thickness is reached. The basic characteristics of ALD process is the saturation of precursors in step 31, meaning the deposition or adsorption of precursors in this step is self limiting, and is sensitive to process time and substrate temperature. The two sets of precursors are react in step 32 after the introduction of the second set of precursors. The purging step 31 is required to separate the two sets of precursors to prevent gas phase reaction and to preserve the surface reaction of ALD process.

Figure 4:
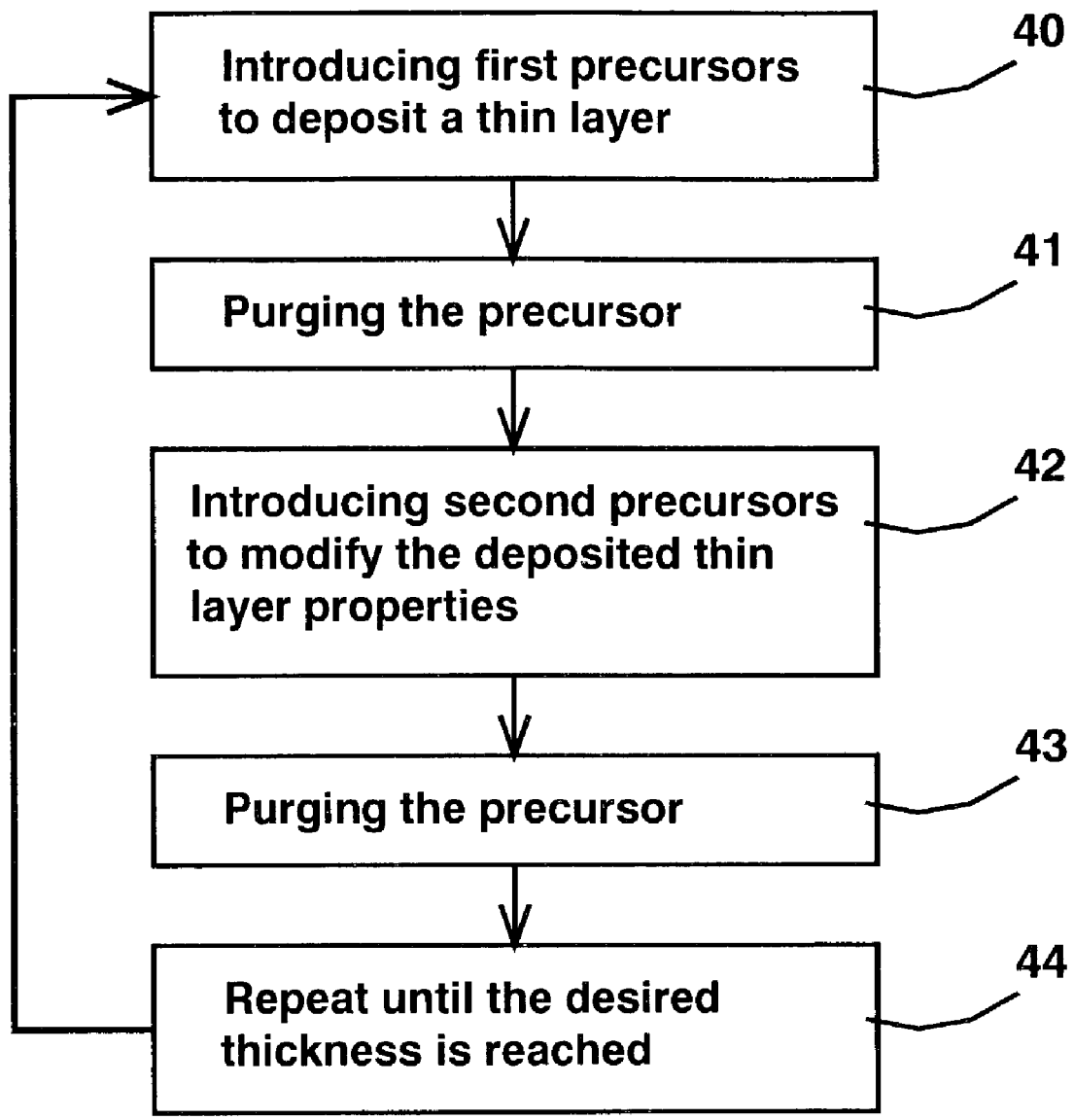
FIG. 4 is a flowchart of the present invention NLD process.

FIG. 4 shows a flowchart of the present invention NLD process. In step 40, the precursors are introduced into the process chamber. Then the precursors are purged from the process chamber in step 41. Another set of precursors is introduced into the process chamber in step 42. Then this set of precursors is purged from the process chamber in step 43. This purging step 43 is optional. The sequence can be repeated in step 44 until a desired thickness is reached. The basic characteristics of NLD process is the non self limiting nature of the deposition in step 41, meaning the deposition of precursors in this step is dependent on process time and substrate temperature. The two sets of precursors are not react with each other in step 42. Instead, the second set of precursors react with the products of the first set of precursors, resulting after step 40. The purging step 41 is normally needed to separate the two sets of precursors to prevent gas phase reaction, but may not be required in all cases because NLD process does not depend on the two sets of precursors interacting.

The present NLD method to deposit a film differs significantly from CVD method with a sequential process and with the introduction of the second set of precursors. The present NLD method differs from pulse or sequential CVD with a purging step and with the introduction of the second set of precursors. The cyclic sequential deposition using two sets of precursors with a purging step separating these two sets of precursors allows the modification of the deposited film in a manner not possible in CVD and pulse and sequential CVD methods. The following examples discuss the advantages of NLD versus CVD. In saying CVD, it also includes pulse CVD or sequential CVD methods.

An example is the surface coverage property of a deposited film. A typical CVD process would run at high temperature and continuously until a film is deposited. The uniformity and surface coverage of the CVD process would depend solely on the reaction mechanism of the chemical precursors and the initial substrate surface. In contrast the present invention NLD method provides a second set of precursors to modify the substrate surface characteristics during the deposition time, effectively allowing a substrate surface similar to the initial surface all the time to prevent surface property changes during the deposition process. NLD method offers an extra controllability to modify the substrate surface during deposition time to improve the surface coverage property of the deposited film. An NLD silicon dioxide deposition using TEOS and oxygen as the first set of precursors and plasma argon or hydrogen or nitrogen as the second set of precursors offers more uniformity and surface coverage at a thin film than CVD process using TEOS/oxygen alone. Similarly, an NLD silicon nitride deposition process using silane/ammonia as a first precursors and plasma argon or hydrogen or nitrogen as the second set of precursors offers more uniformity and surface coverage at a thin film than CVD process using silane/ammonia alone.

Another example is the process temperature of a deposited film. The CVD process temperature is determined by the reaction mechanism to provide an acceptable quality film. Lower the process temperature in CVD process could change the deposited film properties such as impurity incorporation due to incomplete reaction, different stoichiometry of the film components. In contrast, the present invention NLD method can run at a lower temperature than CVD method and still offers acceptable quality film due to the ability to modify the deposited film at low temperature to obtain the desired film properties. This is also a distinction of the NLD method from the CVD method where the substrate temperature of the NLD method is lower than the CVD method for the same set of first precursors. Since the deposition step in both NLD and CVD depends on the substrate temperature, a lower substrate temperature would offer a lower deposition rate, and a better controllability of the deposited film such as surface coverage.

Another example is the densification of a deposited film. CVD method would deposit a complete film, then subject the whole film to a treatment such as annealing. Since the whole film is thick, the annealing would take a long time, and in some cases, certain limitation of diffusion could prevent the heat treatment to reach the bottom of the deposited film. In contrast, the present invention NLD method offers the cyclic sequential method of depositing and heat treatment of a small fraction of the whole film. The whole film will be deposited a number of time, each time with only a fraction of the thickness. Since the fraction of the thickness is much thinner than the whole film thickness, the heat treatment would be short and effective. The number of cycles can chosen to optimize the film quality or the short process time.

Another example is the capability of composition modification of the deposited film such as the carbon removal treatment of a carbon-containing deposited film. CVD method would deposit a complete film containing a certain amount of carbon, then subject the whole film to an energetic species such as plasma hydrogen to react with the carbon to remove the carbon from the deposited film. To reach a thick film, the energy needed for the energetic species would be very high, in many cases impractical and potentially cause damage to the deposited film or the underlying substrate. In contrast, the present invention NLD method offers the cyclic sequential method of depositing and carbon removal treatment of a small fraction of the whole film. Since the film to be treated is much thinner, and can be chosen as thin as one desires, the energy of the energetic species can be low and within the range of practicality, to remove the carbon and not damage the deposited film or the underlying substrate.

Another example is the avoidance of gas phase reaction such as the deposition of TiN using TDMAT (tetra dimethyl amine titanium) metal organic precursor with $NH_3$. CVD method would impractical since TDMAT would react with $NH_3$ in gas phase to create particles and roughen the deposited film. A CVD deposition of the whole film using TDMAT and then subjected the deposited film with $NH_3$ would not be possible to treat the whole film thickness. In contrast, the present invention NLD method offers the cyclic sequential method of depositing using TDMAT and $NH_3$ treatment of a small fraction of the whole film. With a deposited film thickness of TDMAT of less than a few nanometer (1-2 nm), the treatment of $NH_3$ would be effective, and only the cyclic sequential method of NLD would be able to provide. Similarly results can be obtained from TDEAT, TMEAT for titanium organic metal precursors, PDMAT, PDEAT for tantalum organic metal precursors, other organic metal precursors such as copper hfac tmvs, inorganic precursors such as copper hfac (I), copper hfac (II), copper iodine, copper chloride, titanium chloride together with plasma treatment of $N_2$, $H_2$, Ar, He, or $NH_3$.

Another example is the modification of the property of the deposited film such as the deposition of a oxygen-rich film, a nitrogen-rich film, an oxy-nitride film, or a metal-rich film. To vary the content of any component in a deposited film such as oxygen, CVD method would require the adjustment of all the precursor components. This is not an easy task since the incorporation of a element is not directly proportional to its presence in the precursor vapor form. Many times it is not even possible to modify the resulting film components since CVD is a product of a chemical reaction, and any excess precursors would not participate in the reaction. In contrast, the present invention NLD method offers the cyclic sequential method of depositing and treatment of a small fraction of the whole film. The treatment step is a separate step and can be designed to achieve the desired results. If an oxygen-rich film is desired, a energetic oxygen treatment step such as a plasma oxygen, or an ozone flow, could incorporate more oxygen into the deposited film. The incorporation can be done if the deposited film is thin enough, a condition only available in the present invention NLD method, not CVD. If an nitrogen-rich film is desired, a energetic nitrogen treatment step such as a plasma nitrogen, or an ammonia ($NH_3$) flow, could incorporate more nitrogen into the deposited film. If an oxynitride film is desired, a energetic oxygen treatment step could incorporate more oxygen into the deposited film of nitride, or a energetic nitrogen treatment step could incorporate more nitrogen into the deposited film of oxide.

Another example is the incorporation of impurity to modify the deposited film property such as copper doped aluminum film, carbon doped silicon dioxide film, fluorine doped silicon dioxide film. For example, the electromigration resistance of pure aluminum is poor, and this resistance is much improved with the incorporation of a small amount of copper, typically of less than a few percents. CVD method would have to invent compatible precursors of aluminum and copper that can deposit a desired mixture. In contrast, the present invention NLD method offers the cyclic sequential method of depositing a fraction of the aluminum film and incorporate copper into the film fraction during the treatment sequence. Since the deposition uses the aluminum precursors and the treatment uses the copper precursors, and these precursors are separately and sequentially introduced into the process chamber, compatibility is not a big issue.

Another example is the deposition of multilayer films or nanolaminate films. Nanolaminate films are multilayer films but the different layers can be very thin, sometimes not complete layers, and sometimes even less than a monolayer. A CVD method would be impractical as it requires multiple process chamber and the capability of moving between these chambers without incurring contamination and impurities. In contrast, the present invention NLD method offers the cyclic sequential method of depositing a first layer film, and then deposit a second layer film during the treatment sequence. The first layer could be as thin as one desired, such as a fraction of a monolayer, or as thick as one desired, such as a few nanometer.

The present NLD method to deposit a film also differs significantly from ALD method with a non self-limiting deposition step. The deposition step in the present invention NLD method is a function of substrate temperature and process time. The deposition/adsorption step in ALD method is a self-limiting step based on the saturation of precursor ligands on the substrate surface. Once the surface is saturated, the deposition/adsorption in ALD method stops and any excess precursor vapors have no further effect on the saturated surface. In other words, the deposition/adsorption step of ALD method is independent of time after reaching saturation. The ALD method also has less dependent on substrate temperature than CVD or NLD methods. Therefore the present invention NLD method has many distinct differences from ALD method.

One example is the non self-limiting feature of the present invention NLD method allows the NLD method to share the precursors of CVD method, in contrast to the inability of ALD method to use CVD precursors. The deposition step of the present invention NLD method is similar to the deposition step of the CVD method, with the possible exception of lower temperature, therefore the NLD method can use all the precursors of the CVD methods, including the newly developed metal organic precursors or organic metal precursors (MOCVD precursors). In contrast, the precursor requirements of ALD are different because of the different deposition mechanisms. ALD precursors must have a self-limiting effect so that the precursor is adsorbed on the substrate, up to a monolayer. Because of this self limiting effect, only one monolayer or a sub-monolayer is deposited per cycle, and additional precursor will not be deposited on the grown layer even when excess precursor or additional time is supplied. The precursor designed for ALD must readily adsorb at bonding site on the deposited surface in a self-limiting mode. Once adsorbed, the precursor must react with the reactant to form the desired film. These requirements are different from CVD, where the precursors arrive at the substrate together and the film is deposited continuously from the reaction of the precursors at the substrate surface. Thus many useful CVD precursors are not viable as ALD precursors and vice versa. And it is not trivial or obvious to select a precursor for the ALD method.

Another example is the ease of incorporation of the enhancement of CVD technology such as plasma technology, rapid thermal processing technology. By sharing precursors with CVD, the NLD method also can share all the advancement of CVD without much modification. A plasma deposition step in NLD can be designed and tested quickly because of the available knowledge in CVD method.

Another example is the substrate surface preparation. This is a consequence of the different deposition mechanism of NLD and ALD. In ALD, the substrate and substrate preparation are very critical and are a part of the deposition process since different surfaces and surface preparations will lead to different film quality and properties. In contrast, in NLD, similar deposition process occurs with different surface preparations or different surfaces because the basic mechanism is the deposition step, depending only on precursors reaction and the energy supplied, and depending little on the substrate surface. The only dependence of NLD on the substrate surfaces is the nucleation time, since different surfaces have different time for the precursors to nucleate and start depositing. This characteristic is observed in our laboratory when we deposit TiN using NLD process on different substrates, a silicon dioxide substrate, an organic polymer substrate, and a porous dielectric substrate. The TiN films on these 3 different substrates have similar film quality and properties, with only different in thickness, due to the difference in nucleation times on different surfaces. Deposition of epitaxial films also requires intensive preparation of the substrate so that the first layer of atoms deposited would grow epitaxially or in an ordered arrangement from the substrate crystal. NLD process of non-epitaxial film allows conformal deposition or highly uniform coverage of a thin film over the vias and trenches, and especially high aspect ratio structures in semiconductor devices.

Another example is the ability to use MOCVD precursors. The MOCVD precursors contain a significant amount of carbon due to its organic content. The present invention NLD process uses MOCVD precursors with ease due to the deposition step using MOCVD precursors and the treatment step to remove any carbon left behind during the deposition step. An effective carbon removal step is the introduction of energetic hydrogen or nitrogen such as plasma hydrogen or nitrogen. In contrast, the use of MOCVD precursors in ALD method would demand significant research, and so far to the best of our knowledge, there is no commercially successful ALD process available using MOCVD precursors.

Another example is the non self-limiting feature of the present invention NLD method also allows the NLD method to adjust the thickness of the deposition step, or the treatment step, or both, to achieve a higher thickness per cycle. The ALD method is based on the saturation of ligands on the substrate surface, therefore the thickness per cycle is fixed and cannot be changed. In contrast, the thickness per cycle in the present invention NLD method is a function of process temperature and process time. The optimum thickness for NLD process is the largest thickness per cycle and still able to be treated during the treatment step. An NLD process deposits TiN using TDMAT precursor and plasma nitrogen treatment can have the thickness per cycle any where from sub nanometer to a few nanometers. The ability to vary the thickness per cycle allows the NLD process to use less cycles for the same total film thickness, leading to a faster process time and offering higher throughput than ALD process.

Another example is the non self-limiting feature of the present invention NLD method also allows the NLD method to vary the individual thickness of the resulting film, such as a few thicker or thinner layers in the middle of the deposited film, a manner not possible in ALD method. Some applications require a thick film where the film quality is only critical to the interface, the center portion of the film can be deposited with a very high thickness per cycle to increase the throughput while the beginning and the end of the deposition use a much thinner thickness per cycle to satisfy the requirement of a high quality interfaces. This feature is not possible with ALD process where all the cycles having the same thickness per cycle.

Another example is the process temperature of a deposited film. The ALD process temperature is largely fixed by the chemical reactions between the ligands of the precursors, and therefore ALD method is insensitive to the substrate temperature. In contrast, the present invention NLD method can run at a slightly higher temperature than ALD to offers the deposition characteristics, meaning a process dependent on process temperature and time. Furthermore, the NLD process can run at a much higher temperature to provide a larger thickness per cycle. The variation in thickness per cycle of NLD process can be accomplished by changing the substrate temperature, where a higher temperature would result in a high deposition rate, leading to a larger thickness per cycle. The change in substrate temperature is probably best accomplished by rapid thermal processing using radiative heat transfer for fast response time. A resistive heated substrate could provide the baseline temperature, and a lamp heating would provide the increase in temperature needed for larger thickness per cycle.

Another example is that it is not essential to have a purging step between the deposition and the treatment in the present invention NLD method because it is possible that the precursors in both steps are compatible. In contrast, ALD method requires the purging step between these two steps because of the designed reaction at the substrate surface. The purging step in NLD method helps overall in the cyclic sequential deposition scheme where the incompatibility of the two sets of precursors could cause potential damage. In rare cases where the two sets of precursors are compatible, the purging step is not critical and can be reduced or eliminated to improve the throughput.

Another example is the controllability of surface coverage. ALD method has excellent conformality and surface coverage, meaning this method will provide a theoretically perfect coverage of any configuration, as long as there is a pathway to it. But ALD is not capable of turning off this feature, meaning the excellent surface coverage is a characteristics of the ALD method. In contrast, in the present invention NLD, the surface coverage characteristics can be modified. In general, because of the deposition step in NLD is based on CVD, the thinner the thickness per cycle in NLD is, the better the surface coverage is. This degree of control offers NLD an unexpected advantage in porous substrate. ALD deposition on an open-pored porous substrate will travel through all the pores and deposit everywhere, potentially shorting the circuit if the deposited film is conductive. In contrast, NLD method can deliver a very high deposition rate at the beginning of the deposition cycle, effectively sealing off the open pores before starting deposition of a high quality thin film. By turning off the surface coverage feature, the degree of penetration of NLD into the porous material is significantly less than ALD method. Using this scheme, we have demonstrated a less penetration of the deposited film into the porous substrate. With further optimization, we believe that no penetration might be possible.

Another example is the flexibility of chamber design. The throughput of ALD is determined by the cycle time due to the independent of the thickness per cycle feature of ALD method. Therefore the chamber design in ALD is highly critical to achieve an acceptable throughput. ALD throughput depends strongly on many issues of chamber design, such as small chamber volume to ensure fast saturation and fast removal of precursors, fast switching valves to ensure quick response time of precursor on-off, uniform precursor delivery to ensure non-depletion effect of precursor. The fast response time requirement of ALD also puts a constraint on the timing requirement such as the synchronization of the precursor flow, the purging steps. In contrast, in the present invention NLD method, the chamber design issues are not any where as critical because of the potential higher thickness per cycle feature, leading to less number of cycles and higher throughput. Therefore a conventional CVD chamber with large volume, slow valve response time is adequate to perform NLD process. The NLD process could benefit from the chamber design of ALD, but NLD has the flexibility of trading some of the throughput for the simplicity of chamber design because the throughput of NLD without any chamber design consideration could be adequate for many applications. The advantage of the flexibility in chamber design is the ease of incorporate high density plasma into NLD process. High density plasma design requires a large chamber volume to equalize the energy of the charged and neutral particles due to high collision, and this requirement constraint contradicts with the small chamber volume requirement of ALD process, but acceptable with NLD process.

What is claimed is:

1. An improved method to deposit a film on a substrate comprising a non-planar surface having at least one sidewall and a planar surface, said film comprised of a plurality of layers under same deposition conditions, the improvement comprising treating said layers as said layers are deposited to form said film which is conformal in composition and thickness on the non-planar and the planar surfaces, wherein the treatment uses a high density plasma.

2. An improved method to deposit a film on a substrate comprising a non-planar surface having at least one sidewall and a planar surface, said film comprised of a plurality of layers under same deposition conditions, the improvement comprising depositing a fraction of the film before treating and modifying the plurality of layers to form said film wherein the film is conformal in composition and thickness on the non-planar and the planar surfaces, wherein the treatment uses a high density plasma.

3. An improved method to deposit a conformal film in composition and thickness on a non-planar surface having at least one sidewall and a planar surface of a substrate, said film comprised of a plurality of layers under same deposition conditions, the improvement comprising treating the deposited plurality of layers throughout deposition of the film to deposit a conformal film, wherein the treatment uses a high density plasma.

4. A deposition method to deposit a conformal film in composition and thickness on a non-planar surface having at least one sidewall and a planar surface of a substrate, the conformal film comprised of a plurality of layers under same deposition conditions, the deposition method comprising:

introducing a first plurality of precursors into a reaction chamber, the reaction chamber containing a substrate;

depositing a first layer from the first plurality of precursors on the substrate, the deposition being not self-limiting;

purging the first plurality of precursors from the reaction chamber;

treating the first layer with a second plurality of precursors to modify said first layer;

adding at least one subsequent layer; and repeating the treating step on the at least one subsequent layer to modify said at least one subsequent layer, wherein the treating step is performed throughout the deposition of the film to modify deposited layers and to form a conformal film, wherein the treatment uses a high density plasma.

5. The method of claim 4 wherein the treating step further comprises applying thermal energy.

6. The method of claim 4 wherein the treating step further uses high pressure plasma having pressure in the range from 0.1 to 5 Torr.

7. The method of claim 4 wherein the treating step further comprises applying a bias voltage.

8. The method of claim 4 wherein the treating step further comprises changing the composition of the deposited layers.

9. A method to deposit a film on a substrate to achieve a conformal film in composition and thickness on the non-planar surface having at least one sidewall and the planar surface of the substrate, the film comprised of a plurality of layers under same deposition conditions, the method comprising:

depositing a first layer from a first precursor;

treating the first layer;

depositing a second layer from a second precursor;

treating the second layer without exposing the second layer to atmosphere; and repeating the depositing and treating steps until attaining the film with a plurality of desired properties, wherein the treatment uses a high density plasma.

10. The method of claim 9 wherein the first precursor is identical to the second precursor.

11. The method of claim 9 wherein the first precursor is different from the second precursor.

12. The method of claim 9 further comprising a third depositing step of a third precursor after the second treating step; and a third treating step after the third depositing step.

13. A method to deposit a film on a substrate to achieve a conformal film in composition and thickness on the non-planar surface having at least one sidewall and the planar surface of the substrate, the film comprised of a plurality of layers under same deposition conditions, the method comprising:

depositing a first layer from a first precursor;

treating the first layer;

depositing a second layer from a second precursor;

treating the second layer; and repeating the depositing and treating steps, wherein the treatment uses a high density plasma.

* * * * *